(12) United States Patent
Lee et al.

(10) Patent No.: US 8,487,798 B2
(45) Date of Patent: Jul. 16, 2013

(54) SYNTHESIS METHOD OF SIGMA-DELTA MODULATOR CAPABLE OF RELAXING CIRCUIT SPECIFICATION AND REDUCING POWER

(75) Inventors: Shuenn-Yuh Lee, Chia-Yi (TW); Jia-Hua Hong, Keelung (TW); Jing-Yi Wong, Tainan (TW)

(73) Assignee: National Chung Cheng University, Chia-Yi (TW)

( * ) Notice: Subject to any disclaimer, the term of this patent is extended or adjusted under 35 U.S.C. 154(b) by 0 days.

(21) Appl. No.: 13/429,020

(22) Filed: Mar. 23, 2012

(65) Prior Publication Data

US 2013/0050000 A1    Feb. 28, 2013

(30) Foreign Application Priority Data

Aug. 26, 2011  (TW) ................. 100130706

(51) Int. Cl.
    *H03M 3/00*      (2006.01)

(52) U.S. Cl.
    USPC .......................... 341/143; 341/120

(58) Field of Classification Search
    USPC ............ 341/143, 120, 110, 136, 118, 172, 341/161, 119; 375/316, 219, 350
    See application file for complete search history.

(56) References Cited

U.S. PATENT DOCUMENTS 7,936,293 B2 *   5/2011   Hamashita ............... 341/143

OTHER PUBLICATIONS

Piero Malcovati et al., Behavioral Modeling of Switched-Capacitor Sigma-Delta Modulators, Mar. 2003, pp. 352-364, vol. 50, No. 3, IEEE Trancsactions on Circuits and Systems.
Kenneth Francken et al., A High-Level Simulation and Synthesis Environment for ΔΣ Modulators, Aug. 2003, pp. 1049-1061, vol. 22, No. 8, IEEE Transactions on Computer-Aided Design of Integrated Circuts and Systems.
Ovidiu Bajdechi et al., Systematic Design Exploration of Delta-Sigma ADCs, Jan. 2004, pp. 86-95, vol. 51, No. 1, IEEE Transactions on Circuits and Systems-I: Regular Papers.
Jesus Ruiz-Amaya et al., High-Level Synthesis of Switched-Capacitor, Switched-Current and Continuous-Time ΔΣ Modulators Using SIMULINK-Based Time-Domain Behavioral Models, Sep. 2005, pp. 1795-1810, vol. 52, No. 9, IEEE Transactions on Circuits and Systems-I: Regular Papers.
Hashem Zare-Hoseini et al, Modeling of Switched-Capacitor Delta-Sigma Modulators in SIMULINK, Aug. 2005, pp. 1646-1654, vol. 54, No. 4, IEEE Transactions on Instrumentation and Measurement.
Hua Tang et al., High-Level Synthesis of ΔΣ Modulator Topologies Optimized for Complexity, Sensitivity, and Power Consumption, Mar. 2006, pp. 597-607, vol. 25, No. 3, IEEE Transactions on Computer-Aided Design of Integrated Circuits and Systems.
Shuenn-Yuh Lee, A Lower-Power Design Algorithm for Sigma-Delta Modulators with Relaxation of Required Circuit Specifications, Oct. 2011, eight pages, MATLAB/Simulink.

* cited by examiner

*Primary Examiner* — Joseph Lauture
(74) *Attorney, Agent, or Firm* — Muncy, Geissler, Olds & Lowe, PLLC

(57) ABSTRACT

A synthesis method of Sigma-Delta modulator capable of relaxing circuit specification and reducing power consumption, comprising the following steps: firstly, set a target bandwidth and a target performance; upon obtaining a Noise Transfer Function (NTF), perform coefficient synthesis a first time, to ascertain a plurality sets of first performance results corresponding to said NTF, and obtain a plurality sets of first circuit specifications fulfilling said target performance, through analyzing circuit non-ideal effect of said first performance results. Next, increase an oversampling ratio of parameters, to obtain a plurality sets of second performance results, and a plurality sets of second circuit specifications. Then, increase quantizer bit number, and increase attenuation quantity, to obtain a plurality sets of third circuit specifications. Finally, compare said first, second and third circuit specifications, to select one of greatest variation to perform calibrations.

10 Claims, 10 Drawing Sheets

| | | |
|---|---|---|
| 1: [ 3 , 128 , 1 ] | 7: [ 4 , 64 , 1 ] | 13: [ 5 , 64 , 1 ] |
| 2: [ 3 , 64 , 2 ] | 8: [ 4 , 32 , 2 ] | 14: [ 5 , 32 , 2 ] |
| 3: [ 3 , 128 , 2 ] | 9: [ 4 , 64 , 2 ] | 15: [ 5 , 64 , 2 ] |
| 4: [ 3 , 32 , 3 ] | 10: [ 4 , 16 , 3 ] | 16: [ 5 , 16 , 3 ] |
| 5: [ 3 , 64 , 3 ] | 11: [ 4 , 32 , 3 ] | 17: [ 5 , 32 , 3 ] |
| 6: [ 3 , 128 , 3 ] | 12: [ 4 , 64 , 3 ] | 18: [ 5 , 64 , 3 ] |

Data: [N, OSR, Q-bit]

SYNTHESIS METHOD OF SIGMA-DELTA MODULATOR CAPABLE OF RELAXING CIRCUIT SPECIFICATION AND REDUCING POWER

BACKGROUND OF THE INVENTION

1. Field of the Invention

The present invention relates to a synthesis method of a Sigma-Delta modulator, and in particular to a synthesis method of a Sigma-Delta modulator capable of relaxing circuit specifications and reducing power consumption.

2. The Prior Arts

Analog-to-Digital Converter (ADC) plays a fairly important role in various electronic products. In recent years, Sigma-Delta modulator has been utilized extensively in ADC to realized functions of Analog-to-Digital Conversion, so it can be found in MP3/MP4 or hearing aid, or in handset of GSM system. In recent years, energy conservation has become an important issue, and that leads to the consequence that, in addition to stressing high efficiency and low cost, the Electronic Industry also puts emphasis on reducing power consumption. Therefore, how to design products efficiently while meeting the desired specification is a critical issue.

In the prior art, in designing a Sigma-Delta modulator, firstly, a set of frame work, oversampling ratio, order number, quantizer bit number nearing the target specification are synthesized through a system. Then, a series of circuit non-ideal effect analyses, such as analyses on thermal noise, limited open-loop gain, non-linearity characteristics, limited bandwidth, and slew rate of an Operational Amplifier are performed, to obtain the minimum circuit specification of a Sigma-Delta modulator meeting the system requirements. However, through this approach of design, only specifications of Sigma-Delta modulator can be obtained, yet the objective of reducing power consumption can not be achieved.

Therefore, presently, the method of synthesizing a Sigma-Delta Modulator is not quite satisfactory, and it has much room for further improvements.

SUMMARY OF THE INVENTION

In view of the problems and shortcomings of the prior art, the present invention provides a synthesis method of Sigma-Delta modulator, capable of relaxing circuit specifications while reducing power consumption.

A major objective of the present invention is to provide a synthesis method of a Sigma-Delta modulator capable of relaxing circuit specifications and reducing power consumption, such that through addition of two sets of new design algorithms and limitation conditions, a more complete implementation approach can be obtained, for relaxing specifications of an operational amplifier, and reducing bottleneck and difficulty in designing an operational amplifier.

Another objective of the present invention is to provide a synthesis method of Sigma-Delta modulator, capable of relaxing circuit specification and reducing power consumption, such that it can obtain ultimately all the implementation configurations, and the corresponding circuit specifications, for the user to make his own selection, so that the design of the Sigma-Delta modulator can be more flexible.

A further objective of the present invention is to provide a synthesis method of Sigma-Delta modulator, capable of relaxing circuit specification and reducing power consumption, such that it utilizes raised oversampling ratio, quantizer bit number, to increase system ultimate performance, and also it gradually increments the attenuation rate, for the subsequent analysis of non-ideal effect of an operational amplifier, and calculation of required circuit specifications.

To achieve the objective mentioned above, the present invention provides a synthesis method of Sigma-Delta modulator capable of relaxing circuit specification and reducing power consumption, comprising the following steps: (a) set a target bandwidth and a target performance; (b) select a filter type, and a Sigma-Delta modulator configuration type, and set initial values of a plurality of parameters, to obtain a Noise Transfer Function (NTF) of the Sigma-Delta modulator, and perform coefficient synthesis the first time, so as to ascertain a plurality sets of first performance result corresponding to the Noise Transfer Function (NTF); (c) analyze the circuit non-ideal effect of the first performance results, to obtain a plurality sets of first circuit specifications fulfilling the target performance; (d) raise the oversampling ratio of the parameter based on the first performance results, to increase the system ultimate performance; (e) increase the attenuation quantity of the Noise Transfer Function (NTF), so that the system ultimate performance is greater than the target performance, and perform coefficient synthesis the second time, to obtain a plurality sets of second performance results and a plurality of corresponding coefficient values; (f) analyze the circuit non-ideal effect of the second performance results, to obtain a plurality sets of second circuit specifications fulfilling the target performance; (g) raise the quantizer bit number in the parameter, and increase again the attenuation quantity, so that the system ultimate performance is greater than the target performance, and perform coefficient synthesis the third time, to obtain a plurality sets of third performance results and a plurality of corresponding coefficient values; (h) analyze the circuit non-ideal effect of the third performance results, to obtain a plurality sets of third circuit specifications fulfilling the target performance; and (i) compare the first, second, and third circuit specifications obtained in steps (c), (f), and (h), to select the one having the greatest variation and perform the -calibrations required.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed descriptions with reference to the attached drawings.

The present invention provides a synthesis method of a Sigma-Delta Modulator, capable of relaxing circuit specification and reducing power consumption, which utilizes raised oversampling ratio to increase the system ultimate performance, and it analyzes the non-ideal effects of the operation amplifier through gradually incrementing the attenuation quantity, to obtain the circuit specifications required under various different conditions. Or, it utilizes raised quantizer bit number to increase the system ultimate performance, and it analyzes the non-ideal effect of the operation amplifier through gradually incrementing the attenuation quantity, to obtain the circuit specifications required under various different conditions.

Figure 1:
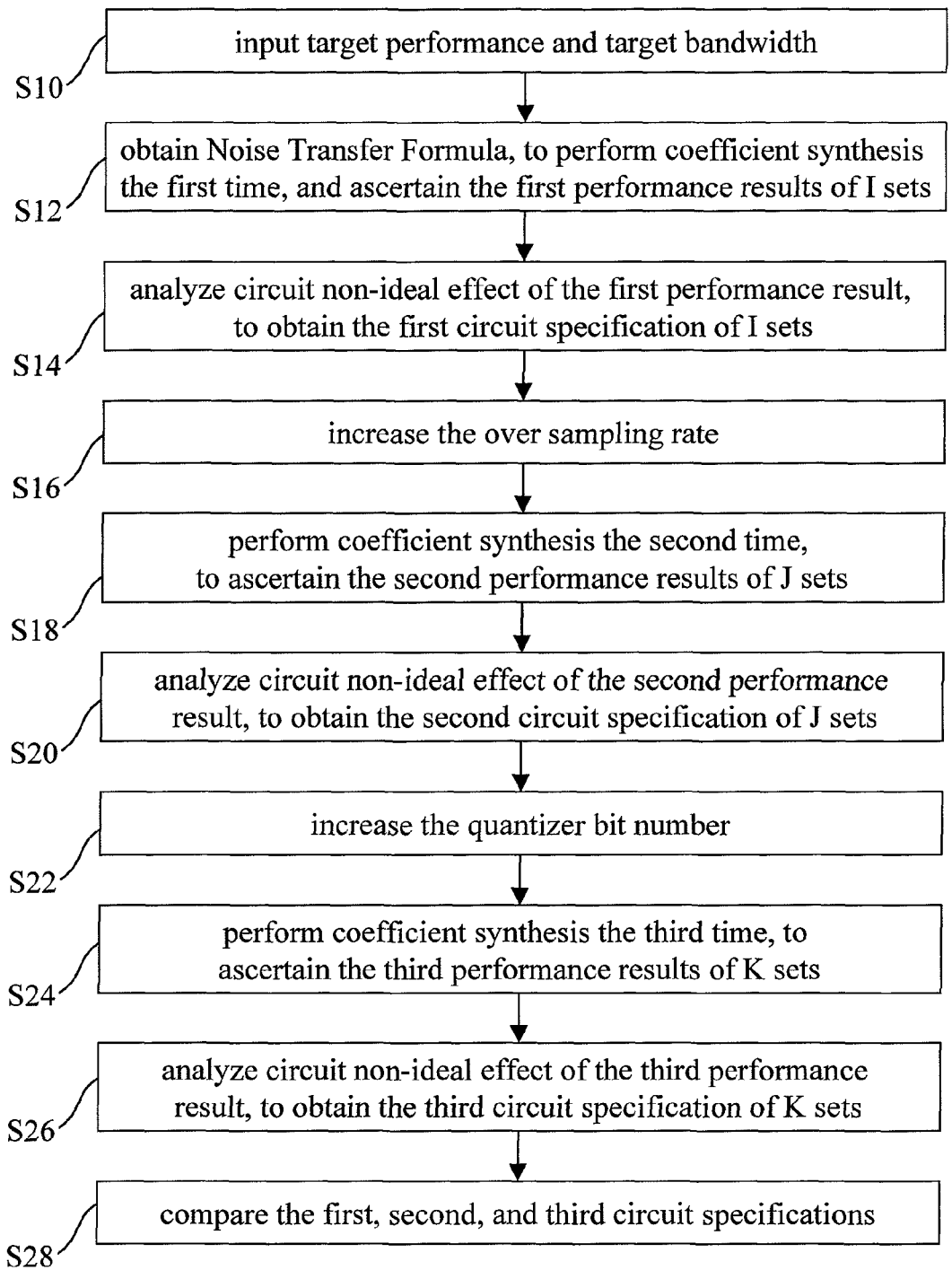
FIG. 1 is a flowchart of the steps of a synthesis method of a Sigma-Delta Modulator, capable of relaxing circuit specification and reducing power consumption according to the present invention.

Refer to FIG. 1 for a flowchart of the steps of a synthesis method of a Sigma-Delta Modulator capable of relaxing circuit specification and reducing power consumption according to the present invention, comprising the following steps. Firstly, as shown in step S10, set a target bandwidth and a target performance. Next, as shown in step S12, upon obtaining a Noise Transfer Function (NTF) of the Sigma-Delta Modulator, perform coefficient synthesis the first time, to ascertain I sets of first performance results corresponding to the NTF. In this step, firstly select a filter type and a Sigma-Delta Modulator configuration type, and upon setting initial values of a plurality of parameters, obtain a Noise Transfer Function (NTF) of the Sigma-Delta Modulator, then synthesize the coefficients to ascertain the first performance result. Wherein, the filter is of a Butterworth or an inverse-Chebyshev type, and the configuration of the Sigma-Delta Modulator is of a Feed-Forward or a Multi-Feedback type; and the parameters include: order number, oversampling ratio, quantizer bit number, and attenuation quantity.

Then, as shown in step S14, analyze the circuit non-ideal effect relative to I sets of the first performance results, such as thermal noise, limited open-loop gain and non-linearity of the operation amplifier, and limited bandwidth and slew rate of the operational amplifier, then, arrange the analysis result to obtain the I sets of the first circuit specifications satisfying target performance, such that the first circuit specification is the specification of the operational amplifier.

Subsequently, in step S16, increase the over sampling ratio (OSR) in the parameter based on the first performance result, to raise the system ultimate performance. Then, in step S18, increase the attenuation quantity (As) in the Noise Transfer Function (NTF), so that the system ultimate performance is greater than the target performance, then perform coefficient synthesis the second time, to obtain J sets of realizable second performance results and corresponding coefficient values. Then, in step S20, analyze the circuit non-ideal effect of the second performance result, to obtain J sets of the second circuit specifications satisfying target performance. Then, in step S22, increase the quantizer bit number (Q) in the parameter, and increase again the attenuation quantity, so that the system ultimate performance is greater than the target performance. In step S24, perform coefficient synthesis the third time, to obtain K sets of the third performance results and corresponding coefficient values. Then, in step S26, analyze the circuit non-ideal effect of the third performance results, to obtain K sets of the third circuit specification satisfying target performance. And finally, in step S28, compare I sets of the first circuit specifications obtained in step S14, J sets of the second circuit specifications obtained in step S20, and K sets of the third circuit specifications obtained in step S26, to select the specification of the greatest variation, for the designer to make calibrations based on the configuration and circuit specification desired to be realized. Wherein, the first, second, and third circuit specifications are specifications of an operation amplifier.

Figure 2:
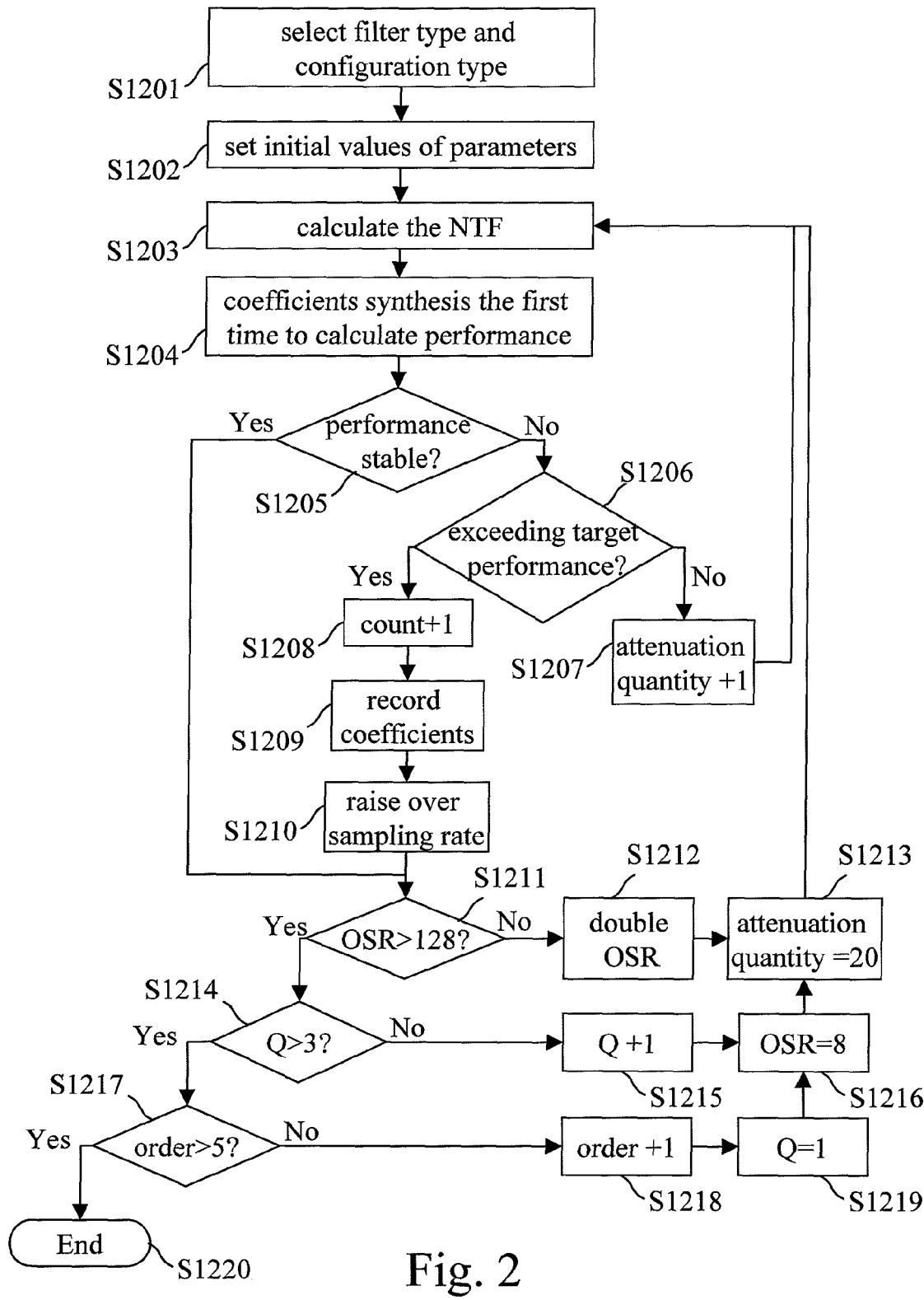
FIG. 2 is a flowchart of the detailed steps in step S12 of FIG. 1 according to the present invention.

Then, refer to FIG. 2 for a flowchart of the detailed steps of step S12 in FIG. 1 according to the present invention. As shown in FIG. 2, firstly, in step S1201, select a filter type, and a Sigma-Delta modulator configuration type. In step S1202, set the initial values of various parameters. Then, in step S1203, calculate the Noise Transfer Function (NTF) of the Sigma-Delta modulator based on various settings in steps S1201 and S1202. In step S1204, perform coefficient synthesis the first time, and calculate to ascertain the performances of the configuration corresponding to the Noise Transfer Function (NTF), and that are referred to as the first performance results of altogether I sets. In step S1205, determine if the first performance result of the first set from the I sets is stable, if the answer is positive, perform step S1211, otherwise, in step S1206, to determine if the first performance result exceeds the target performance set at the beginning, if the answer if negative, then in step S1207, add 1 to the attenuation quantity, are return to step S1203 to recalculate the Noise Transfer Function (NTF), otherwise, that means that the set satisfies the specification, then as shown in steps S1208 to S1209, add 1 to the count, such that the performance result is the first performance result of the next set, and record the various parameters and system configuration coefficients of the first performance result of the set presently determined. In step S1210, increase the oversampling ratio (OSR) to 129, and in step S1211, determine if the oversampling ratio (OSR) is greater than 128, in case the answer is positive, proceed with step S1214, otherwise as shown in steps S1212 and S1213, double OSR and define again the attenuation quantity of NTF as 20. In step S1214, determine if the quantizer bit number (Q) is greater than 3, and if the answer is positive, proceed with step S1217, otherwise as shown in steps S1215 and S1216, add 1 to the quantizer bit number (Q), to redefine the OSR as 8. In step S1217, determine if the order number (N) of the Sigma-Delta Modulator is greater than 5, if the answer is positive, then as shown in step S1220, terminate the process, otherwise, as shown in steps S1218 and S1219, add 1 to the order number of the Sigma-Delta modulator, and reset the quantizer bit number to 1, the over sampling rate to 8, and attenuation quantity to 20, and return to step S1203 to recalculate the Noise Transfer Function (NTF).

Figure 3:
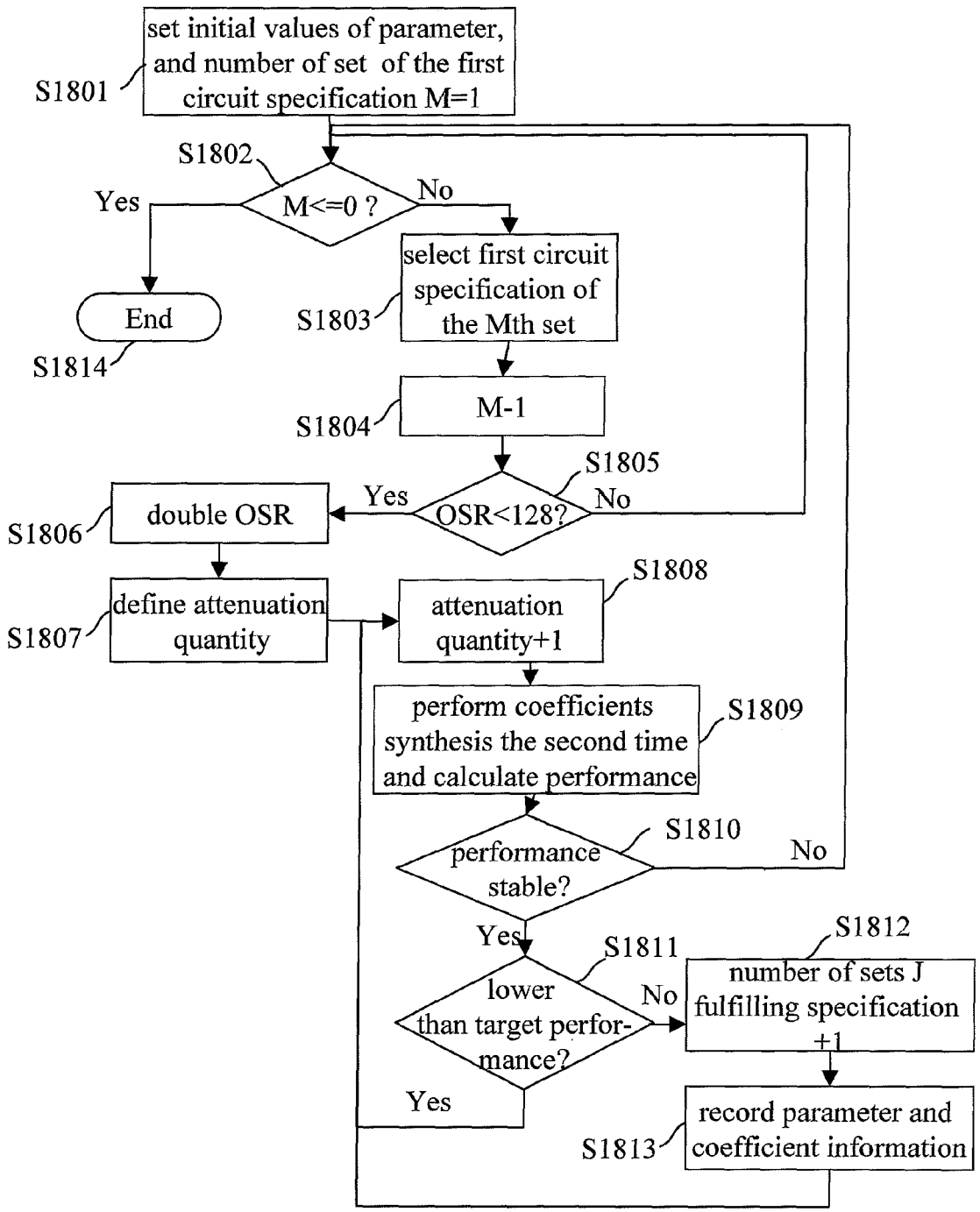
FIG. 3 is a flowchart of the detailed steps in step S18 of FIG. 1 according to the present invention.

Then, refer to FIG. 3 for a flowchart of the detailed steps of step S18 in FIG. 1 according to the present invention. As shown in FIG. 3, firstly, in step S1801, set the initial values of various parameters, including setting the set number of the second performance result at the beginning as set 0, and select the Mth set from I sets of the first circuit specification, then in step S1801 set M to I. Then, in step S1802, determine at this time if it has finished calculating the first circuit specifications of all the I sets, and in case the answer is positive, then as shown in step S1814, terminate the process; otherwise, in step S1803, select the first circuit specification of the Mth set, and in step S1804 deduct 1 from M. Then, in step S1805, determine if the OSR of the first circuit specification of the Mth set is less than 128, and if the answer is negative, return to step S1802, otherwise, as shown in steps S1806 to S1808, double the OSR, redefine the attenuation quantity of OSR of NTF as 20, and add 1 to the attenuation quantity. Then, in step S1809, perform coefficient synthesis the second time, to calculate and ascertain the performance of the configuration corresponding to the NTF, and refer to it as the second performance result having altogether J sets. In step S1810, determine if the system performance is stable, in case the answer is negative, return to step S1802, otherwise, as shown in step S1811, determine if the performance result of the first circuit specification of the Mth set is less than the target performance, in case the answer is positive, return to step S1808 and add 1 to the attenuation quantity, otherwise, as shown in step S1812, that means that the first circuit specification satisfies the specification, and add 1 to the number J satisfying specification, and in step S1813, record the order number of Sigma-Delta Modulator (N), oversampling ratio (OSR), quantizer bit number (Q), attenuation quantity (As), and system configuration coefficients, and return to step S1808, to increment the attenuation quantity continuously to determine if the performance of coefficient synthesis is stable and useful.

Figure 4:
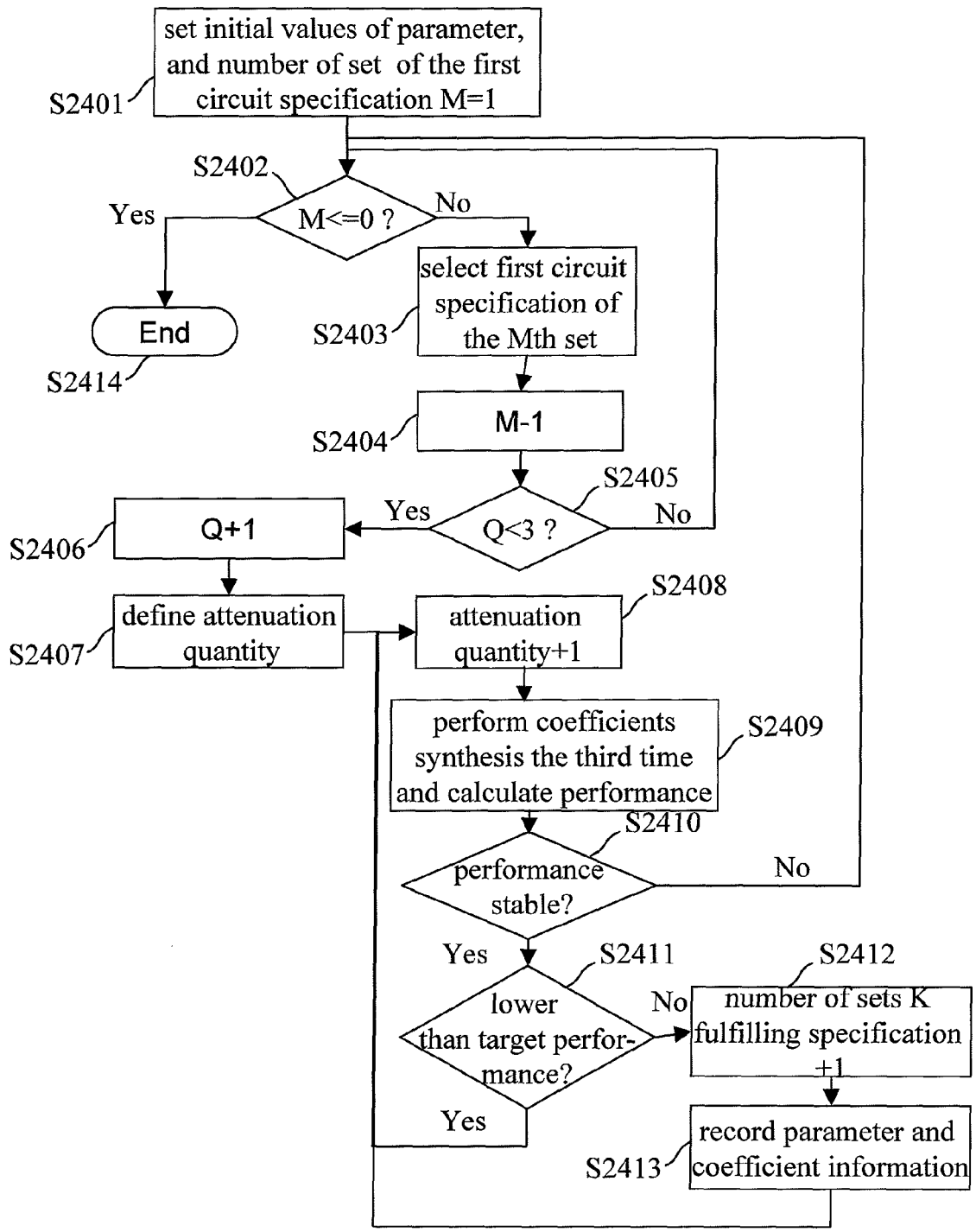
FIG. 4 is a flowchart of the detailed steps in step S24 of FIG. 1 according to the present invention.

Subsequently, refer to FIG. 4 for a flowchart of the detailed steps of step S24 in FIG. 1 according to the present invention. As shown in FIG. 4, firstly, in step S2401, set the initial values of various parameters, including setting the set number of the second performance result at the beginning as set 0, and select the Mth set from I sets of the first circuit specification, then in step S2401 set M to I. Then, in step S2402, determine at this time if it has finished calculating the first circuit specifications of all the I sets, and in case the answer is positive, then as shown in step S2414, terminate the process, otherwise, in step S2403, select the first circuit specification of the Mth set, and in step S2404 deduct 1 from M. Then, in step S2405, determine if the quantizer bit number of the first circuit specification of the Mth set is less than 3, and if the answer is negative, return to step S2402, otherwise, as shown in steps S2406 to S2408, add 1 to quantizer bit number, redefine the attenuation quantity of NTF as 20, and add 1 to the attenuation quantity. Then, in step S2409, perform coefficient synthesis the third time, to calculate and ascertain the performance of the configuration corresponding to the NTF, and refer to it as the third performance result of all the K sets. In step S2410, determine if the system performance is stable, in case the answer is negative, return to step S2402, otherwise, as shown in step S2411, determine if the performance of the first circuit specification of the Mth set is lower than the target performance, in case the answer is positive, return to step S2408 and add 1 to the attenuation quantity, otherwise, as shown in step S2412, that means that the first circuit specification satisfies the specification required, and add 1 to the number J satisfying the specification, and in step S2413, record the order number of Sigma-Delta Modulator (N), oversampling ratio (OSR), quantizer bit number (Q), attenuation quantity (As), and system configuration coefficients, and return to step S2408, increment continuously the attenuation quantity to determine if the performance of coefficient synthesis is stable and useful.

Figure 5:
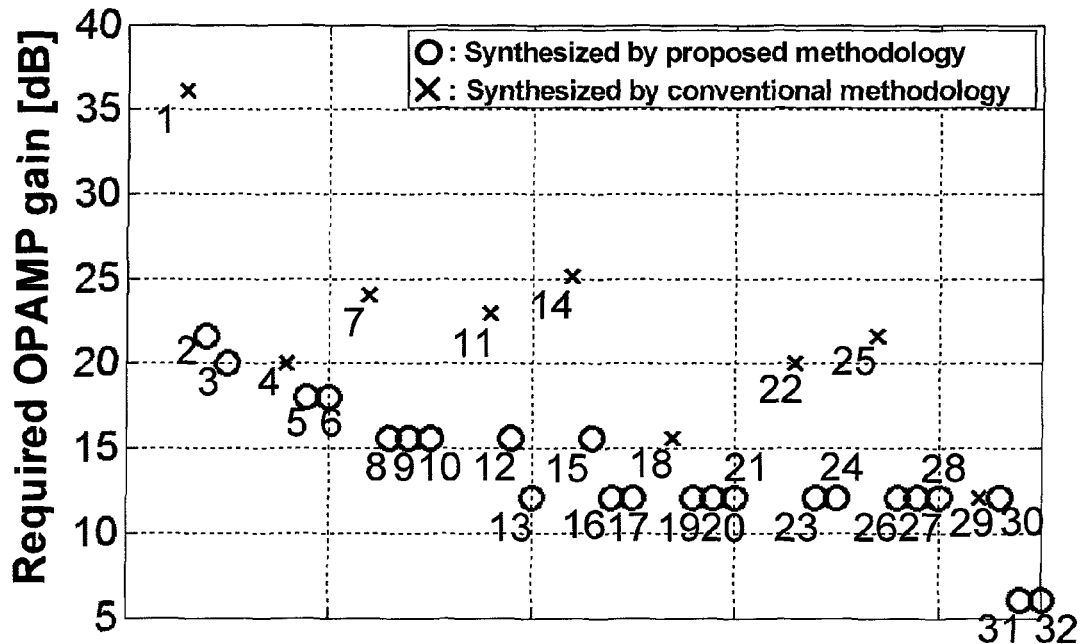
FIG. 5 is a graph of results of raising the system ultimate performance through increasing the oversampling ratio, to obtain the operational amplifier open-loop gain satisfying various specifications of the Sigma-Delta modulator according to a preferred embodiment of the present invention.

FIG. 5 is a graph of the results of raising the system ultimate performance through increasing the oversampling ratio, to obtain the operational amplifier open-loop gain satisfying various specifications of the Sigma-Delta modulator according to a preferred embodiment of the present invention. As shown in FIG. 5, the simulation results is obtained through increasing the oversampling ratio (OSR), having target performance of 70 dB, and target bandwidth of 250 kHz. In a standard of fixed target specification, through the improved design method of the present invention, various parameters satisfying the specifications can be obtained: order number of Sigma-Delta Modulator (N), oversampling ratio (OSR), quantizer bit number (Q), to obtain the open-loop gain of operational amplifier as required. Based on the simulation results and compared with the conventional design method, a more complete Sigma-Delta modulator satisfying various specifications can be obtained through the improved method of the present invention, with reduced open-loop gain required for the operational amplifier.

Figure 6:
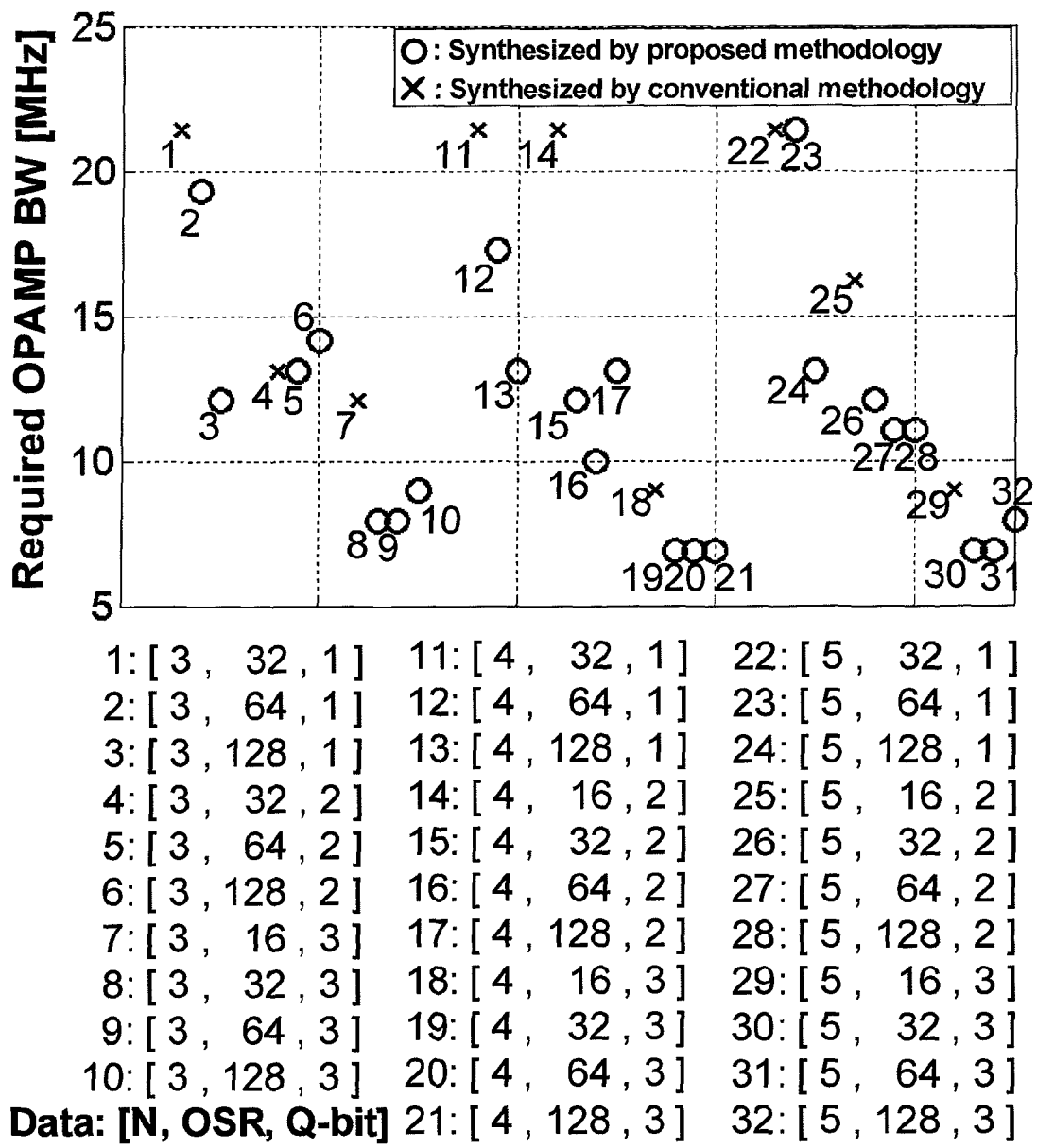
FIG. 6 is a graph of results of raising the system ultimate performance through increasing the over sampling rate, to obtain the operational amplifier bandwidth satisfying various specifications of the Sigma-Delta modulator according to a preferred embodiment of the present invention.

FIG. 6 is a graph of the results of raising the system ultimate performance through increasing the oversampling ratio, to obtain the operational amplifier bandwidth satisfying various specifications of the Sigma-Delta modulator according to a preferred embodiment of the present invention. As shown in FIG. 6, the simulation results is obtained through increasing the oversampling ratio (OSR), having target performance of 70 dB, and target bandwidth of 250 kHz. In a standard of fixed target specification, through the improved design method of the present invention, various parameters satisfying the specifications can be obtained: order number of Sigma-Delta Modulator (N), oversampling ratio (OSR), quantizer bit number (Q), to obtain the bandwidth of operational amplifier required. Based on the simulation results and compared with the conventional design method, a more complete Sigma-Delta modulator satisfying various specifications can be obtained through the improved method of the present invention, with reduced bandwidth required for the operational amplifier.

Figure 7:
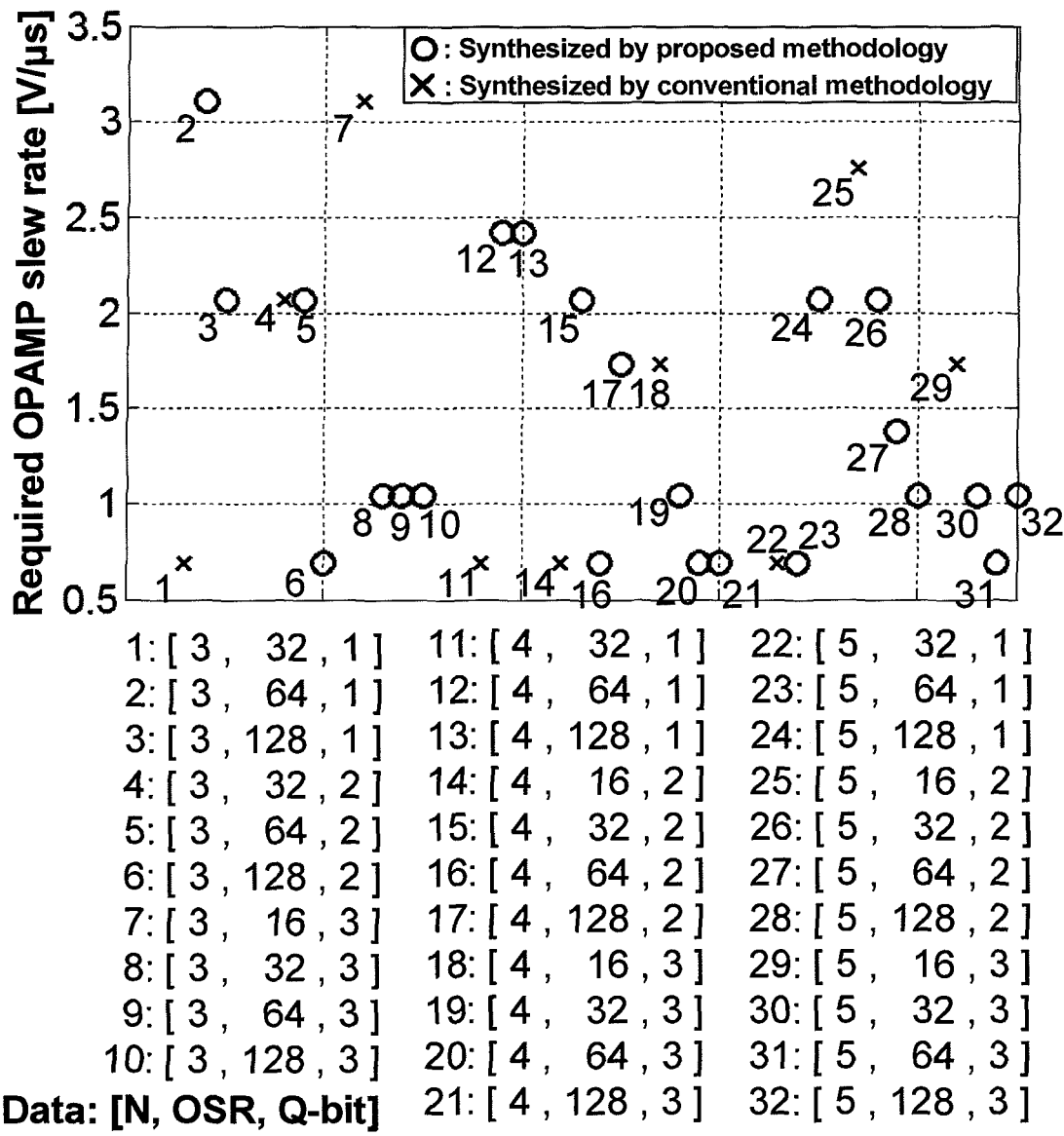
FIG. 7 is a graph of results of raising the system ultimate performance through increasing the over sampling rate, to obtain the operational amplifier vibration rate satisfying various specifications of the Sigma-Delta modulator according to a preferred embodiment of the present invention.

FIG. 7 is a graph of the results of raising the system ultimate performance through increasing the oversampling ratio, to obtain the operational amplifier vibration rate satisfying various specifications of the Sigma-Delta modulator according to a preferred embodiment of the present invention. As shown in FIG. 7, the simulation results is obtained through increasing the oversampling ratio (OSR), having target performance of 70 dB, and target bandwidth of 250 kHz. In a standard of fixed target specification, through the improved design method of the present invention, various parameters satisfying the specifications can be obtained: order number of Sigma-Delta Modulator (N), oversampling ratio (OSR), quantizer bit number (Q), to obtain the slew rate of operation amplifier required. Based on the simulation results and compared with the conventional design method, a more complete Sigma-Delta modulator satisfying various specifications can be obtained through the improved method of the present invention, with reduced vibration rate required for the operation amplifier.

Figure 8:
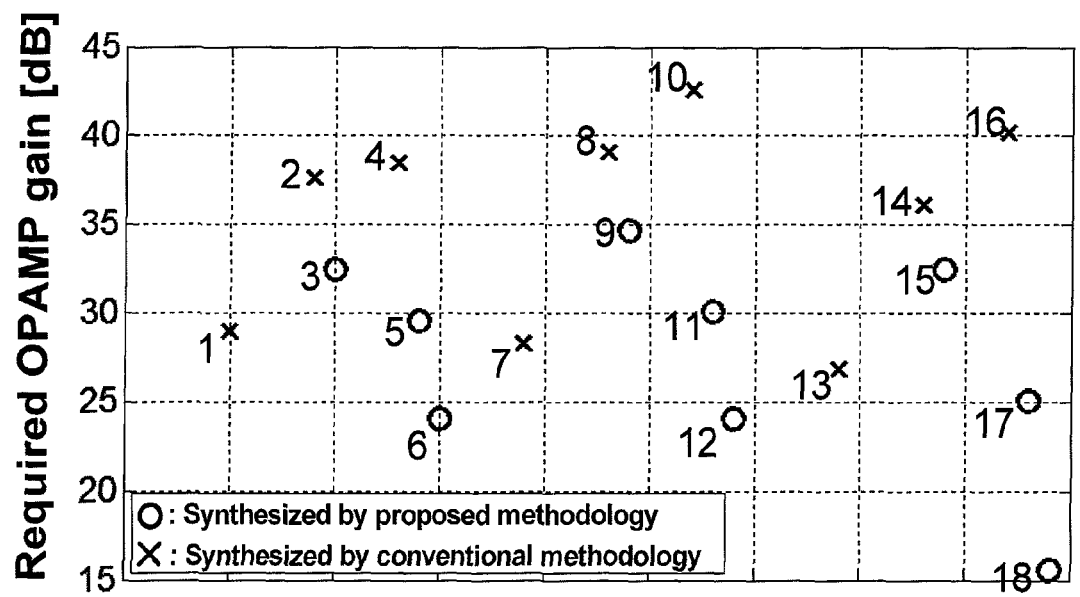
FIG. 8 is a graph of results of raising the system ultimate performance through increasing quantizer bit number, to obtain the operational amplifier open-loop gain satisfying various specifications of the Sigma-Delta modulator according to a preferred embodiment of the present invention.

FIG. 8 is a graph of the results of raising the system ultimate performance through increasing the quantizer bit number, to obtain the operational amplifier open-loop gain satisfying various specifications of the Sigma-Delta modulator according to a preferred embodiment of the present invention. As shown in FIG. 8, the simulation results is obtained through increasing the quantizer bit number (Q), having target performance of 90 dB, and target bandwidth of 20 kHz. In a standard of fixed target specification, through the improved design method of the present invention, various parameters satisfying the specifications can be obtained: order number of Sigma-Delta Modulator (N), oversampling ratio (OSR), quantizer bit number (Q), to obtain the open-loop gain of operational amplifier required. Based on the simulation results and compared with the conventional design method, a more complete Sigma-Delta modulator satisfying various specifications can be obtained through the improved method of the present invention, with reduced open-loop gain required for the operational amplifier.

Figure 9:
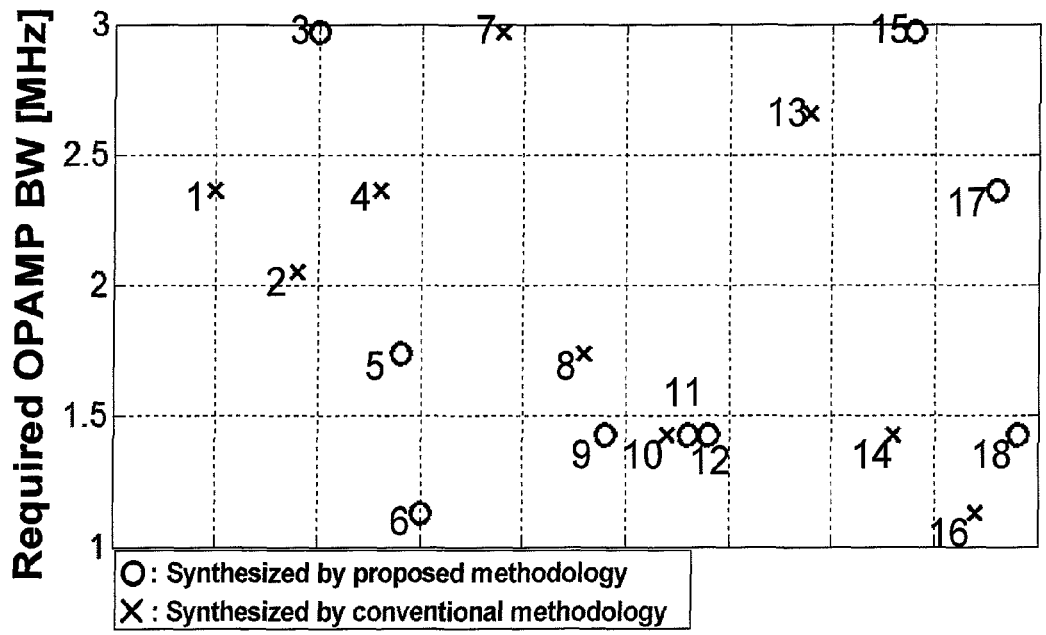
FIG. 9 is a graph of results of raising the system ultimate performance through increasing quantizer bit number, to obtain the operational amplifier bandwidth satisfying various specifications of the Sigma-Delta modulator according to a preferred embodiment of the present invention.

FIG. 9 is a graph of the results of raising the system ultimate performance through increasing the quantizer bit number, to obtain the operational amplifier bandwidth satisfying various specifications of the Sigma-Delta modulator according to a preferred embodiment of the present invention. As shown in FIG. 9, the simulation results is obtained through increasing the quantizer bit number (Q), having target performance of 90 dB, and target bandwidth of 20 kHz. In a standard of fixed target specification, through the improved design method of the present invention, various parameters satisfying the specifications can be obtained: order number of Sigma-Delta Modulator (N), over sampling rate (OSR), quantizer bit number (Q), to obtain the bandwidth of operational amplifier required. Based on the simulation results and compared with the conventional design method, a more complete Sigma-Delta modulator satisfying various specifications can be obtained through the improved method of the present invention, with reduced bandwidth required for the operation amplifier.

Figure 10:
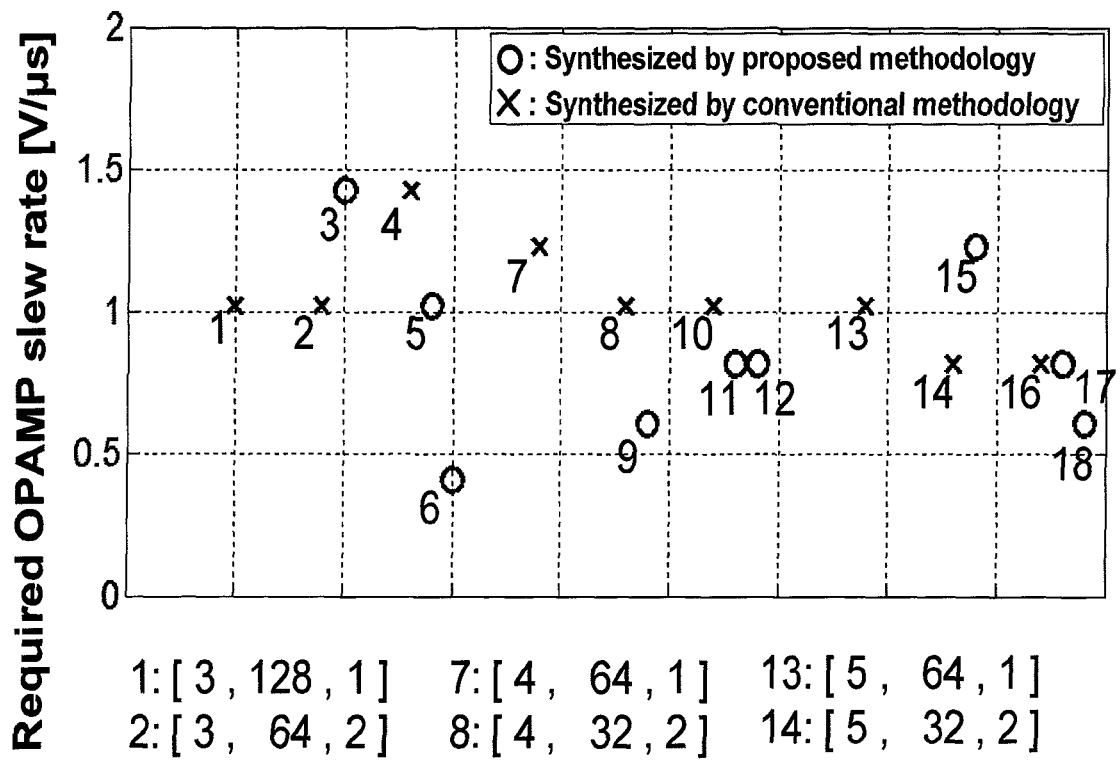
FIG. 10 is a graph of results of raising the system ultimate performance through increasing quantizer bit number, to obtain the operational amplifier slew rate satisfying various specifications of the Sigma-Delta modulator according to a preferred embodiment of the present invention.

FIG. 10 is a graph of the results of raising the system ultimate performance through increasing the quantizer bit number, to obtain the operational amplifier slew rate satisfying various specifications of the Sigma-Delta modulator according to a preferred embodiment of the present invention. As shown in FIG. 10, the simulation results is obtained through increasing the quantizer bit number (Q), having target performance of 90 dB, and target bandwidth of 20 kHz. In a standard of fixed target specification, through the improved design method of the present invention, various parameters satisfying the specifications can be obtained: order number of Sigma-Delta Modulator (N), oversampling ratio (OSR), quantizer bit number (Q), to obtain the slew rate of operational amplifier required. Based on the simulation results and compared with the conventional design method, a more complete Sigma-Delta modulator satisfying various specifications can be obtained through the improved method of the present invention, with reduced slew rate required for the operational amplifier.

Summing up the above, the present invention provides a synthesis method of a Sigma-Delta modulator capable of relaxing circuit specifications and reducing power consumption, which raises the maximum performance attainable by a Sigma-Delta modulator, through raising the oversampling ratio or increasing the quantizer bit number, as based on system target performance and fixed specification. In the present invention, the non-ideal effect of the operational amplifier is analyzed, thus being able to relax specification of the operational amplifier under certain circumstances, while keeping the target performance and signal bandwidth unchanged. Through application of the present invention, not only the specification of the operational amplifier can be relaxed to achieve lower power consumption, but a complete set of multiple design tools are also provided for realizing a Sigma-Delta Modulator.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. A synthesis method of Sigma-Delta modulator capable of relaxing circuit specification and reducing power consumption, comprising the following steps:
   (a) set a target bandwidth and a target performance;
   (b) select a filter type and a Sigma-Delta modulator configuration type, and set initial values of a plurality of parameters, to obtain a Noise Transfer Function (NTF) of said Sigma-Delta modulator, and perform coefficient synthesis a first time, so as to ascertain a plurality sets of first performance results corresponding to said Noise Transfer Function (NTF);
   (c) analyze a plurality of circuit non-ideal effects of said first performance result, to obtain a plurality sets of first circuit specifications fulfilling said target performance;
   (d) raise an oversampling ratio of parameters based on said first performance result, to increase system ultimate performance;
   (e) increase attenuation quantity of said Noise Transfer Function (NTF) to make said system ultimate performance greater than said target performance, and perform coefficient synthesis a second time to obtain a plurality sets of second performance results and a plurality of corresponding coefficient values of said parameters;
   (f) analyze a plurality of circuit non-ideal effects of second performance results, to obtain a plurality sets of second circuit specifications fulfilling said target performance;
   (g) raise said quantizer bit number in said parameter, and increase again said attenuation quantity, so that said system ultimate performance is greater than said target performance, and perform coefficient synthesis a third time, to obtain a plurality sets of third performance results and a plurality of said corresponding coefficient values of said parameters;
   (h) analyze a plurality of circuit non-ideal effects of said third performance results, to obtain a plurality sets of third circuit specifications fulfilling said target performance; and
   (i) compare said first, second, and third circuit specifications obtained in steps (c), (f), and (h), to select the one having greatest variation to perform calibrations required.

2. The synthesis method of Sigma-Delta modulator capable of relaxing circuit specification and reducing power consumption as claimed in claim 1, wherein said filter is of a Butterwoth or Inverse-Chebyshev type.

3. The synthesis method of Sigma-Delta modulator capable of relaxing circuit specification and reducing power consumption as claimed in claim 1, wherein configuration of said Sigma-Delta modulator is of a Feed-Forward or a Multi-Feedback type.

4. The synthesis method of Sigma-Delta modulator capable of relaxing circuit specification and reducing power consumption as claimed in claim 1, wherein said parameter includes: an oversampling ratio, a quantizer bit number, an attenuation quantity, and an order number of said Sigma-Delta modulator.

5. The synthesis method of Sigma-Delta modulator capable of relaxing circuit specification and reducing power consumption as claimed in claim 1, wherein said circuit non-ideal effects include: thermal noise, limited open-loop gain, non-linearity, limited bandwidth, and slew rate of said operational amplifier.

6. The synthesis method of Sigma-Delta modulator capable of relaxing circuit specification and reducing power consumption as claimed in claim 1, wherein said step (c) further includes following steps:
calculate said first performance result of each set respectively, to determine if it is stable and exceeds said target performance;
if said first performance effect is not stable and not exceeding said target performance, return to step (b) to recalculate said Noise Transfer Function (NTF), or if it exceeds said target performance, then increase said oversampling ratio; and
determine if all said parameters exceed said target performance, if answer is positive, perform step (d), otherwise adjust values of said parameters, and return to said step (b), to recalculate said Noise Transfer Function 0 (NTF).

7. The synthesis method of Sigma-Delta modulator capable of relaxing circuit specification and reducing power consumption as claimed in claim 1, wherein said step (e) further includes following steps:
set initial values of said parameters, and select one of said first circuit specifications, to determine if said oversampling ratio in said parameters is less than said initial value; and
if said oversampling ratio is greater than said initial value, select again a set of said first circuit specifications, otherwise, increase said oversampling ratio and redefine said attenuation quantity, to perform coefficient synthesis a second time, to obtain said second performance results.

8. The synthesis method of Sigma-Delta modulator capable of relaxing circuit specification and reducing power consumption as claimed in claim 1, wherein
said step (f) further includes following steps:
calculate each set of said second performance results respectively, to determine if they are stable;
if they are not stable, select again one set of said first circuit specifications, and repeat said step (c), otherwise, determine if said second performance results are less than said target performance; and
if the answer is positive, return to said step (c), otherwise, number of said second circuit specifications fulfilling requirement is increased.

9. The synthesis method of Sigma-Delta modulator capable of relaxing circuit specification and reducing power consumption as claimed in claim 1, wherein said step (g) further includes following steps:
set initial values of said parameters, and select one of said first circuit specifications, to determine if said quantizer bit number in said parameters is less than said initial value; and
if quantizer bit number is greater than said initial value, select again a set of said first circuit specifications, otherwise, increase said quantizer bit number and redefine said attenuation quantity, to perform coefficient synthesis a third time, to obtain said third performance results.

10. The synthesis method of Sigma-Delta modulator capable of relaxing circuit specification and reducing power consumption as claimed in claim 1, wherein said step (h) further includes following steps:
calculate each set of said third performance results respectively, to determine if they are stable;
if they are not stable, select again one set of said first circuit specifications, and repeat said step (g), otherwise, determine if said third performance results is less than said target performance; and
if an answer is positive, return to said step (g), otherwise, number of said third circuit specifications fulfilling requirement is increased.

\* \* \* \* \*